United States Patent
Xiao et al.

(10) Patent No.: US 12,413,052 B2
(45) Date of Patent: Sep. 9, 2025

(54) ELECTRIC ENERGY SAFETY AUTHENTICATION APPARATUS

(71) Applicant: ELECTRIC POWER RESEARCH INSTITUTE, CHINA SOUTHERN POWER GRID, Guangdong (CN)

(72) Inventors: Yong Xiao, Guangdong (CN); Yun Zhao, Guangdong (CN); Weibin Lin, Guangdong (CN); Chao Cui, Guangdong (CN); Ziwen Cai, Guangdong (CN); Yuxin Lu, Guangdong (CN)

(73) Assignee: ELECTRIC POWER RESEARCH INSTITUTE, CHINA SOUTHERN POWER GRID, Guangdong (CN)

( * ) Notice: Subject to any disclaimer, the term of this patent is extended or adjusted under 35 U.S.C. 154(b) by 0 days.

(21) Appl. No.: 18/562,310

(22) PCT Filed: Mar. 23, 2022

(86) PCT No.: PCT/CN2022/082445
§ 371 (c)(1),
(2) Date: Nov. 19, 2023

(87) PCT Pub. No.: WO2023/060844
PCT Pub. Date: Apr. 20, 2023

(65) Prior Publication Data
US 2024/0275140 A1    Aug. 15, 2024

(30) Foreign Application Priority Data
Oct. 15, 2021    (CN) .......................... 202111204107.4

(51) Int. Cl.
*H02B 1/28*    (2006.01)
*H02B 1/16*    (2006.01)
*H02B 1/46*    (2006.01)

(52) U.S. Cl.
CPC ................. *H02B 1/28* (2013.01); *H02B 1/16* (2013.01); *H02B 1/46* (2013.01)

(58) Field of Classification Search
CPC .......... H02G 3/08; H02G 3/081; H02G 3/088; H02B 1/28; H02B 1/30; H02B 1/16; H02B 1/46; H02B 1/40
(Continued)

(56) References Cited

U.S. PATENT DOCUMENTS

| | | | |
|---|---|---|---|
| 6,740,809 B2 * | 5/2004 | Vacheron | H05K 5/061 174/50 |
| 6,852,924 B2 * | 2/2005 | Lessard | H05K 9/0073 174/58 |

(Continued)

FOREIGN PATENT DOCUMENTS

| | | |
|---|---|---|
| CN | 202076590 U | 12/2011 |
| CN | 108736188 A | 11/2018 |

(Continued)

OTHER PUBLICATIONS

International Search Report for PCT/CN2022/082445 mailed May 30, 2022, ISA/CN.

*Primary Examiner* — Angel R Estrada
(74) *Attorney, Agent, or Firm* — Yue (Robert) Xu; Apex Attorneys at Law, LLP (57) ABSTRACT

Provided is an electric power safety authentication device, including a front casing, a rear casing, a sealing element, and a fastener connection structure. A sealing groove that matches the sealing element is provided at connection between the front and rear casings. The fastener connection structure comprises a first connector, a second connector, a first fastener, a second fastener, a first spring, and second springs. The first fastener is arranged on the front casing, and the second fastener is arranged on the rear casing. The first fastener and the second fastener each comprise a first clamp (Continued)

and a second clamp. The first connector is fit in and fastened to the first fastener, and the second connector is fit in and fastened to the second fastener.

10 Claims, 5 Drawing Sheets

(58) Field of Classification Search
USPC ... 174/50, 520, 51, 535, 559, 561, 564, 565; 220/3.2–3.8, 4.02; 361/600, 601, 641, 361/679.01; 277/312, 314, 345
See application file for complete search history.

(56) References Cited

U.S. PATENT DOCUMENTS

| | | | | |
|---|---|---|---|---|
| 8,519,264 B2* | 8/2013 | Leslie | ............... | H02G 3/088 |
| | | | | 277/652 |
| 8,530,760 B2* | 9/2013 | Taylor | ............... | H05K 5/061 |
| | | | | 174/563 |
| 8,772,635 B2* | 7/2014 | Chen | ............... | H05K 5/061 |
| | | | | 174/50 |
| 8,796,548 B2* | 8/2014 | Rost | ............... | H05K 5/061 |
| | | | | 174/50 |
| 8,867,235 B2* | 10/2014 | Veillette | ............... | H02G 3/083 |
| | | | | 174/559 |
| 8,963,000 B2* | 2/2015 | Xiao | ............... | H02G 3/16 |
| | | | | 174/548 |
| 9,131,609 B2* | 9/2015 | Ochiai | ............... | B60R 16/0239 |
| 2018/0301830 A1 | 10/2018 | Hoyack et al. | | |

FOREIGN PATENT DOCUMENTS

| | | |
|---|---|---|
| CN | 209709469 U | 11/2019 |
| CN | 113872061 A | 12/2021 |
| GB | 1440922 A | 6/1976 |

* cited by examiner

ELECTRIC ENERGY SAFETY AUTHENTICATION APPARATUS

This application is the national phase of International Patent Application No. PCT/CN2022/082445, filed on Mar. 23, 2022, which claims the benefit of Chinese Patent Application No. 202111204107.4, titled "ELECTRIC POWER SAFETY AUTHENTICATION DEVICE AND SYSTEM", filed on Oct. 15, 2021 with the China National Intellectual Property Administration, both of which are incorporated herein by reference in their entireties.

FIELD

The present disclosure relates to the technical filed of auxiliary devices for power production, and in particular to an electric power safety authentication device.

BACKGROUND

With city construction and economic development, the scale and quantity of power production are increasing year by year, resulting in a large number of on-site works for power production departments. For example, power enterprises perform power transmission, power distribution, and power transformation to complete construction, maintenance, and operational support of power facilities such as power transmission lines, power distribution lines, and transformer substations. In dealing with a large number of on-site production works, the power enterprises implement multiple safety mechanisms. Measures such as operation orders and work orders, designated safety personnel, and safety regulations are used to ensure safety of on-site power production works, so as to enhance safety awareness of operators and avoid casualties and device failure. Therefore, electric power safety authentication devices are essential. The safety authentication devices are usually installed in power plants. However, the conventional electric power safety authentication devices have the following advantages.
 1. Water from the outside is prone to infiltrating into internal electronic components of the electric power safety authentication device due to poor waterproof performance of the electric power safety authentication device, which causes short circuits and result in incalculable losses.
 2. Screws are used for connection in installation of the electric power safety authentication device, for which screw holes are not only unfavorable for waterproofing, but also prone to be oxidized and corroded, which is not conducive to installation and disassembly, and thus is not conducive to repair, maintenance, and waterproofing of the device.

SUMMARY

In view of this, an objective of the present disclosure is to provide an electric power safety authentication device to effectively solve the technical problems of poor sealing and inconvenient installation in the conventional technology.

In order to achieve the above objective, the following technical solutions are provided according to the present disclosure.

An electric power safety authentication device includes a front casing, a rear casing, a sealing element, and a fastener connection structure. A sealing groove that matches the sealing element is provided at connection between the front casing and the rear casing. The fastener connection structure includes a first connector, a second connector, a first fastener, a second fastener, a first spring, and second springs. The first spring is arranged inside the sealing element. The first connector and the second connector are arranged at two ends of the first spring respectively, and both the first connector and the second connector penetrate the sealing element. A circular groove is provided on each of the first connector and the second connector. The first fastener is arranged on the front casing, and the second fastener is arranged on the rear casing. The first fastener and the second fastener each include a first clamp and a second clamp. The first clamp and the second clamp are each connected to the front casing or the rear casing through the second spring. The first clamp and the second clamp collectively define a clamping space that matches the circular groove. The first connector is fit in and fastened to the first fastener, and the second connector is fit in and fastened to the second fastener.

Preferably, the first connector and the second connector each include a first cylinder and a second cylinder. The circular groove is provided on the first cylinder. A first end of the second cylinder is detachably connected to the first cylinder, and a second end of the second cylinder is connected to the first spring.

Preferably, the sealing element is an inflatable sealing element. The inflatable sealing element and the second cylinder are connected in a sealed manner.

Preferably, the first cylinder and the second cylinder are connected through a first connecting body in threaded connection.

Preferably, a threaded groove is provided on the second cylinder. The first connecting body is provided with a threaded cylinder that matches the threaded groove.

Preferably, an extension-retraction groove is provided on each of a side of the first clamp and a side of the second clamp, where the two sides face away from each other. A first end of the second spring is installed in the extension-retraction groove, and a second end of the second spring is connected to the front casing or the rear casing through a connecting block.

Preferably, the front casing is provided with a screen on a side away from the rear casing.

Preferably, the rear casing is provided with a metal gasket on a side away from the front casing. The screen is connected to the metal gasket through a wire.

Preferably, the front casing is further provided with insulated buttons on a side away from the rear casing.

Preferably, the number of the fastener connection structure is more than one, and the more than one fastener connection structures are evenly distributed on the sealing element.

Compared with the conventional technology, the present disclosure has the following beneficial effects.
 (1) In use, the first connector is fit in and fastened to the first fastener on the front casing, the second connector is fit in and fastened to the second fastener on the rear casing, and the sealing element is arranged at the connection between the front casing and the rear casing, which ensures the sealing of the connection between the front casing and the rear casing. Each of the first fastener and the second fastener is composed of the first clamp and the second clamp with an adjustable clamping distance between the first clamp and the second clamp, instead of installation through screws in the conventional technology, so that the installation in the present disclosure is convenient and simple, thereby effectively solving the technical problems of poor sealing and inconvenient installation in the conventional technology.

(2) The front casing and the rear casing are installed in a sealed manner only through clamping. In addition, the sealing element has a sealing effect. The installation through screws in the conventional technology is replaced, so that installation holes are eliminated, which reduces the possibility of entry of water, thereby improving waterproof performance.

(3) By setting the first spring, the distance between the first connector and the second connector can be effectively adjusted, so that the connection between the front casing and the rear casing is applicable to distribution boxes with different thicknesses, thereby effectively expanding application scope.

BRIEF DESCRIPTION OF THE DRAWINGS

In order to describe the technical solutions in the embodiments of the present disclosure or in the conventional technology more clearly, the drawings for describing the embodiments or the conventional technology are briefly introduced hereinafter. Apparently, the drawings in the following description show merely the embodiments of the present disclosure, and those skilled in the art can obtain other drawings based on these drawings without creative efforts.

Reference numbers are listed as follows:

100 fastener connection structure
110 first connector
120 second connector
130 circular groove
141 first cylinder
142 second cylinder
150 first connecting body
161 threaded groove
162 threaded cylinder
210 first fastener
220 second fastener
231 first clamp
232 second clamp
240 semicircular clamping groove
310 first spring
320 second spring
330 connecting block
400 sealing element Reference numbers are listed as follows:

410 sealing groove
500 front casing
510 screen
520 insulated button
600 rear casing
610 installation groove
710 first wire
720 second wire
730 metal gasket
740 conductive contact piece

DETAILED DESCRIPTION OF THE EMBODIMENTS

Technical solutions in the embodiments of the present disclosure are clearly and completely described below in conjunction with the drawings of the embodiments of the present disclosure. Apparently, the embodiments described in the following are only some embodiments of the present disclosure, rather than all of the embodiments. Any other embodiments obtained by those skilled in the art based on the embodiments in the present disclosure without any creative efforts fall within the protection scope of the present disclosure.

In the description of the embodiments of the present disclosure, it should be noted that the orientation or positional relationships indicated by the terms such as "central", "upper", "lower", "left", "right", "vertical", "horizontal", "inner", and "outer", are based on the orientation or positional relationships shown in the drawings, which are only used to facilitate the description of the present disclosure and to simplify the description, rather than indicating or implying that the devices or elements referred to must have a specific orientation or can only be configured and operated in a particular orientation. Therefore, the above-mentioned terms should not be construed as limitations to the present disclosure. In addition, terms such as "first", "second", "third" and the like are merely for description, and should not be construed as indicating or implying relative importance.

In the description of the embodiments of the present disclosure, it should be noted that, otherwise clearly specified or limited, terms such as "mounting", "joint" and "connection" should be understood in a broad sense, for example, understood as in a fixed connection, a detachable connection or an integral connection; in a mechanical connection or an electrical connection; in a direct connection or an indirect connection through an intermediate medium, or an internal connection inside two components. For those skilled in the art, the specific meanings of the above terms in the present disclosure can be understood in the light of specific conditions.

With city construction and economic development, the scale and quantity of power production are increasing year by year, resulting in a large number of on-site works for power production departments. For example, power enterprises perform power transmission, power distribution, and power transformation to complete construction, maintenance, and operational support of power facilities such as power transmission lines, power distribution lines, and transformer substations. In dealing with a large number of on-site production works, the power enterprises implement multiple safety mechanisms. Measures such as operation orders and work orders, designated safety personnel, and safety regulations are used to ensure safety of on-site power production works, so as to enhance safety awareness of production operators and avoid casualties and device failure. Therefore, electric power safety authentication devices are essential. The safety authentication devices are usually installed in power plants. However, the conventional electric power safety authentication devices have the following advantages. (1) Water from the outside is prone to infiltrating into internal electronic components of the electric power safety authentication device due to poor waterproof performance of the electric power safety authentication device, which causes a short circuit, thereby resulting in an incalculable loss. (2) Screws are used for connection in installation of the electric power safety authentication device, for which screw holes are not only unfavorable for waterproofing, but also prone to be oxidized and corroded, which is not conducive to installation and disassembly, and thus is not conducive to repair, maintenance, and waterproofing of the device. (3) The electric power safety authentication device has poor anti-static performance and the electric power safety authentication device itself is exposed to an electric field, so that a large amount of static electricity accumulates on a surface of the electric power safety authentication device. The static electricity not only endangers a service life of the device, but also adsorbs dust and bacteria. When a human body is in contact with the safety authentication device, the bacteria contact with the human body and infect the human body, reducing resistance of the human body. An electric power safety authentication device is provided according to this embodiment to effectively solve the technical problems of poor sealing, inconvenient installation, and excessive accumulation of static electricity on the surface existing in the conventional technology.

Referring to FIG. 1 to FIG. 5, an electric power safety authentication device is provided according to an embodiment of the present disclosure. The device includes a front casing 500, a rear casing 600, a sealing element 400, and a fastener connection structure 100. A sealing groove 410 that matches the sealing element 400 is provided at connection between the front casing 500 and the rear casing 600. The fastener connection structure 100 includes a first connector 110, a second connector 120, a first fastener 210, a second fastener 220, a first spring 310, and second springs 320. The first spring 310 is arranged inside the sealing element 400. The first connector 110 and the second connector 120 are arranged at two ends of the first spring 310 respectively, and both the first connector 110 and the second connector 120 penetrate the sealing element 400. A circular groove 130 is provided on each of the first connector 110 and the second connector 120. The first fastener 210 is arranged on the front casing 500, and the second fastener 220 is arranged on the rear casing 600. The first fastener 210 and the second fastener 220 each include a first clamp 231 and a second clamp 232. The first clamp 231 and the second clamp 232 are each connected to the front casing 500 or the rear casing 600 through a second spring 320. The first clamp 231 and the second clamp 232 collectively define a clamping space that matches the circular groove 130. The first connector 110 is fit in and fastened to the first fastener 210, and the second connector 120 is fit in and fastened to the second fastener 220.

Figure 1:
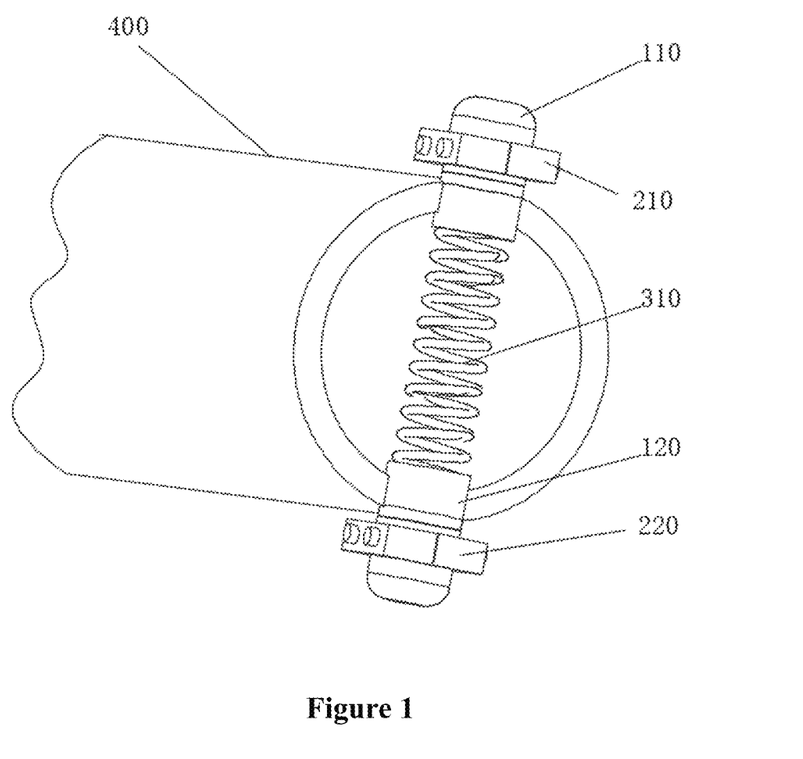
FIG. 1 is a schematic diagram showing connection between a fastener connection structure and a sealing element of an electric power safety authentication device according to an embodiment of the present disclosure.
Figure 2:
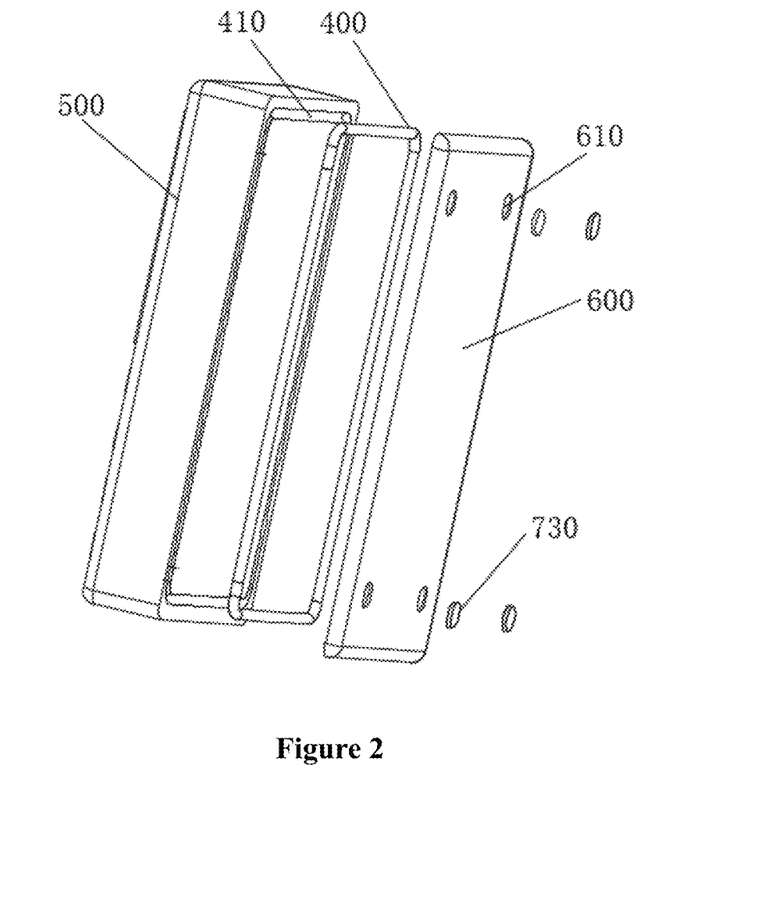
FIG. 2 is a schematic diagram showing installation of a sealing element of an electric power safety authentication device according to an embodiment of the present disclosure.
Figure 3:
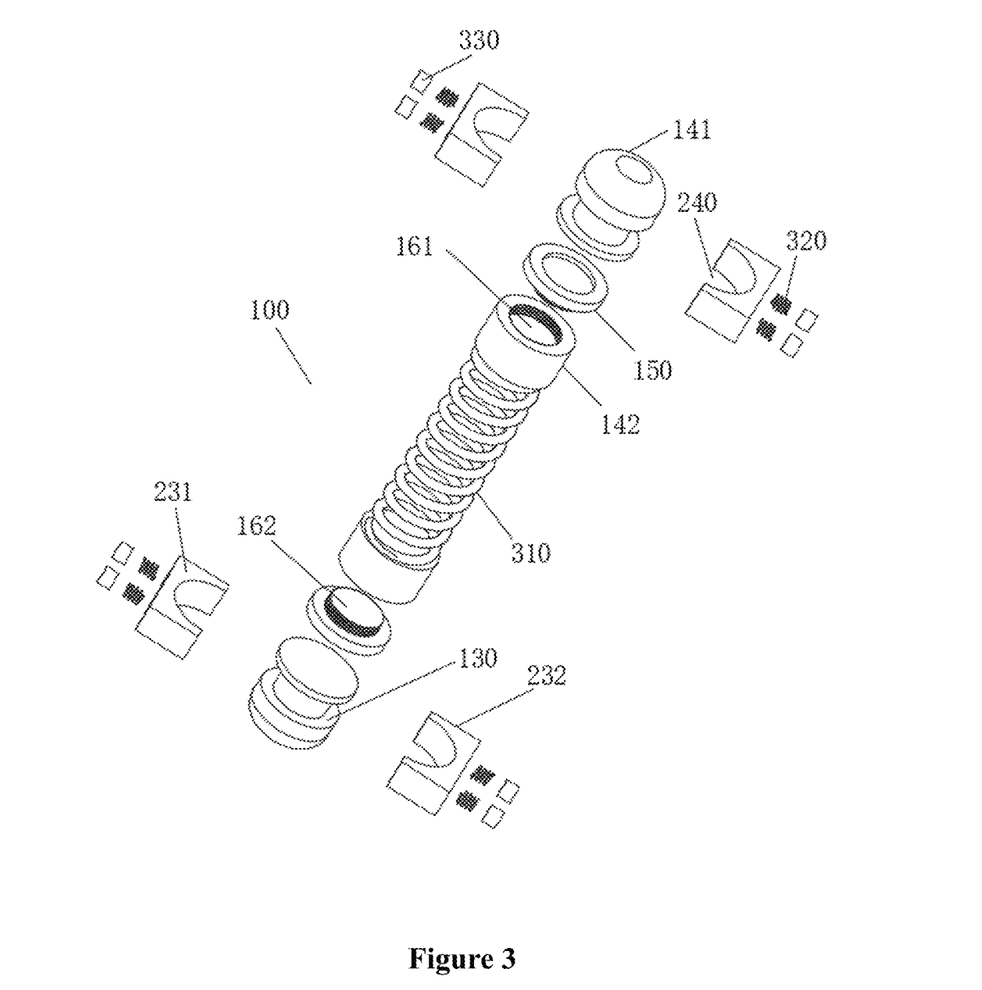
FIG. 3 is a schematic diagram showing an exploded view of a fastener connection structure of an electric power safety authentication device according to an embodiment of the present disclosure.

Specifically, the first clamp 231 and the second clamp 232 that form the first fastener 210 are each arranged on the front casing 500 through a second spring 320, so that the first connector 110 is connected to the front casing 500 through the first fastener 210. The first clamp 231 and second clamp 232 that form the second fastener 220 are each arranged on the rear casing 600 through a second spring 320, so that the second connector 120 is connected to the rear casing 600 through the second fastener 220. The sealing element 400 and sealing groove 410 are each in a circular shape. The sealing groove 410 is provided on an edge of the front casing 500 and an edge of the rear casing 600. The sealing groove 410 on the front casing 500 and the sealing groove 410 on the rear casing 600 collectively define a complete structure that matches the sealing element 400, so that the connection between the front casing 500 and the rear casing 600 is sealed with the sealing element 400. The sealing element 400 matches the sealing grooves 410 and is arranged in the sealing grooves 410, and the fastener connection structure 100 is arranged on the sealing element 400, so that the sealing element 400 can position the fastener connection structure 100, to facilitate the accurate fitting and fastening of the first connector 110 to the first fastener 210 and enables the accurate fitting and fastening of the second connector 120 to the second fastener 220.

Further, in this embodiment, the first connector 110 and the second connector 120 each include a first cylinder 141 and a second cylinder 142. The circular groove 130 is provided on the first cylinder 141. A first end of the second cylinder 142 is detachably connected to the first cylinder 141, and a second end of the second cylinder 142 is connected to the first spring 310. The first connector 110 and the second connector 120 are each divided into the first cylinder 141 and the second cylinder 142, which facilitates processing the first cylinder 141 to form the circular groove 130 and facilitates assembling the two second cylinders 142 with the first spring 310.

More specifically, the first cylinder 141 is in a circular frustum shape at an end away from the second cylinder 142. An inner diameter of the first cylinder 141 at an end away from the second cylinder 142 gradually decreases in a direction away from the second cylinder 142. With such settings, it is easy for the first cylinder 141 to enter the clamping space defined by the first clamp 231 and the second clamp 232, which facilitates the fitting and fastening of the first connector 110 to the first fastener 210 and facilitates the fitting and fastening of the second connector 120 to the second fastener 220.

Furthermore, in this embodiment, the sealing element 400 is implemented as an inflatable sealing element 400. The inflatable sealing element 400 and the second cylinder 142 are connected in a sealed manner. The inflatable sealing element 400 may be inflated to the extent that the sealing element 400 fills all gaps at the connection between the front casing 500 and the rear casing 600. During the inflation of the sealing element 400, the first spring 310 is driven to extend. A continuous elastic tension force for restoring an original state of the first spring 310 causes the front casing 500 and the rear casing 600 to remain under a tight clamping force. By designing generation of two opposite forces, sealing at connection of the device is ensured, so as to ensure a sealed connection between the front casing 500 and the rear casing 600, thereby achieving a waterproof effect.

More specifically, multiple through holes, for the second cylinder 142 to protrude, are provided on the inflatable sealing element 400. An outer wall of the second cylinder 142 and edges of the through holes are connected in a sealed manner.

Furthermore, in this embodiment, the first cylinder 141 and the second cylinder 142 are connected through a first connecting body 150 via threaded connection. The threaded connection is easy to install and resistant to loosening, which not only ensures quickness in connecting the first cylinder 141 and the second cylinder 142 but also ensures stability of the connection between the first cylinder 141 and the second cylinder 142.

More specifically, the first connector 110 and the second connector 120 are symmetrically arranged with respect to a center of the second spring 320. Such arrangement causes interchangeability between the first connector 110 and the second connector 120, which improves convenience in use.

Furthermore, in this embodiment, a threaded groove 161 is provided on the second cylinder 142. The first connecting body 150 is provided with a threaded cylinder 162 that matches the threaded groove 161. The connection between the second cylinder 142 and the first connecting body 150 can be hidden internally through the arrangement of the threaded groove 161 and the threaded cylinder 162, ensuring that the second cylinder 142 and the first connecting body 150 can be connected to each other and the appearance is nice-looking.

More specifically, the first connecting body 150 is connected to the first cylinder 141 through bonding or welding. A maximum outer diameter of the first cylinder 141, a maximum outer diameter of the second cylinder 142, and a maximum outer diameter of the first connecting body 150 are the same. That is, surfaces of the first cylinder 141, the second cylinder 142, and the first connecting body 150 are flush.

Furthermore, in this embodiment, an extension-retraction groove is provided on a side of the first clamp 231 and a side of the second clamp 232, where the two sides face away from each other. A first end of the second spring 320 is installed in the extension-retraction groove, and a second end of the second spring 320 is connected to the front casing 500 or the rear casing 600 through a connecting block 330. The first end of the second spring 320 is connected to an inner wall of the extension-retraction groove, and the second end of the second spring 320 is connected to the front casing 500 or the rear casing 600 through the connecting block 330. Through the extension-retraction grooves, an extension-retraction range of the second spring 320 can be effectively expanded, which facilitates extension and retraction of the second springs 320 on two sides, thereby clamping and fixing the first connector 110 or the second connector 120 better.

More specifically, a semicircular clamping groove 240 is provided on a side of the first clamp 231 and a semicircular clamping groove 240 is provided on a side of the second clamp 232, where the two sides face to each other and the two semicircular clamping grooves 240 match. The two semicircular clamping grooves 240 collectively form a complete clamping groove matching an inner wall of the circular groove 130, so that the first clamp 231 and the second clamp 232 clamp around an outer circumference of the first connector 110 or the second connector 120, thereby achieving an effect of clamping and fixing. At least two second springs 320 are arranged on the first clamp 231, and at least two second springs 320 are arranged on the second clamp 232. Two second springs 320 are symmetrically arranged on the first clamp 231 or the second clamp 232.

Figure 4:
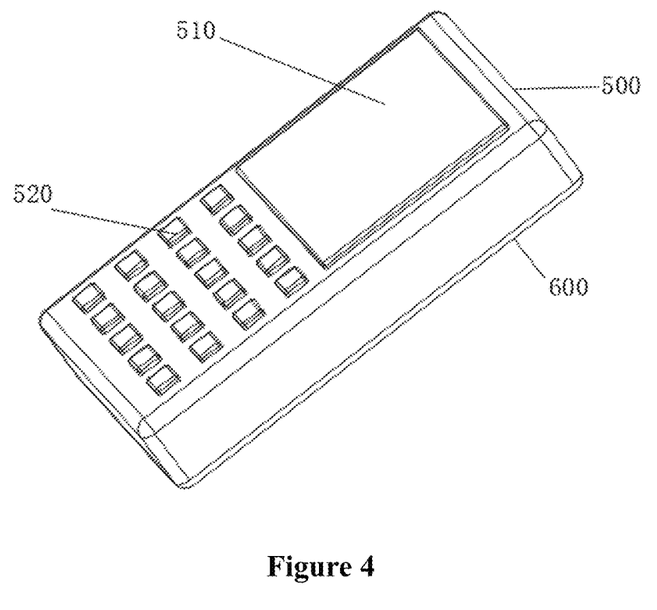
FIG. 4 is a schematic diagram showing a three-dimensional structure of an electric energy safety authentication device according to an embodiment of the present disclosure.

Furthermore, in this embodiment, the front casing 500 is provided with a screen 510 on a side away from the rear casing 600. With the screen 510, authentication of staff through facial recognition can be achieved and non-staff whose faces not recorded cannot be authenticated, so that the staff can safely perform the electric power safety authentication operation with records.

Figure 5:
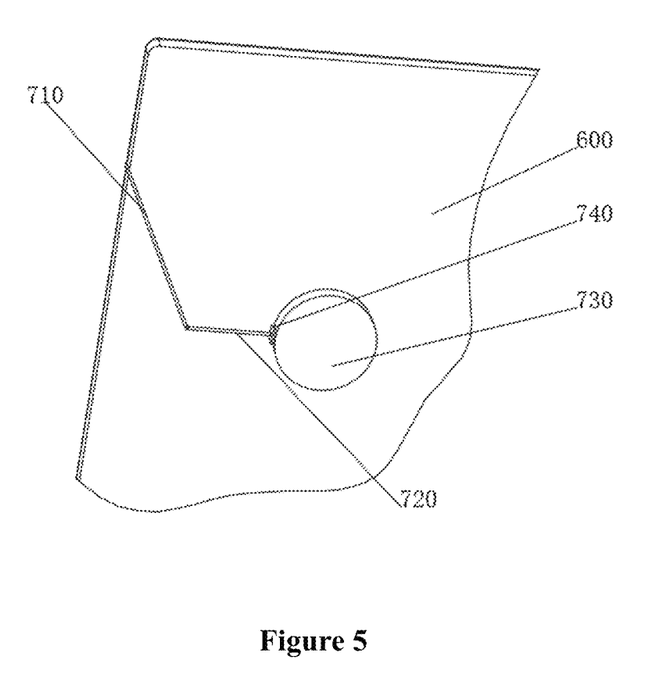
FIG. 5 is a schematic diagram showing installation of a metal gasket of an electrical energy safety authentication device according to an embodiment of the present disclosure.

Furthermore, in this embodiment, the rear casing 600 is provided with a metal gasket 730 on a side away from the front casing 500 (i.e. the back of the rear casing 600). The screen 510 is connected to the metal gasket 730 through a wire. An installation groove 610 is provided on the back of the rear casing 600. The metal gasket 730 is installed in the installation groove 610, and the metal gasket 730 is flush with the back of the rear casing 600, which enables the metal gasket 730 to be in contact with the wall after installation. In this way, static electricity grounding is achieved through a series of circuits to successfully transfer static electricity, so as to eliminate the static electricity effect of the device through the circuits, thereby achieving a beneficial anti-static effect.

More specifically, an inner wall of the front casing 500 is fixedly connected to the screen 510. An outer wall on a side of the screen 510 is fixedly connected to a first wire 710. An inner wall of the rear casing 600 is fixedly connected to multiple second wires 720. Another end of the first wire 710 is electrically connected to an end of each second wire 720, and other ends of the second wires 720 are connected to metal gaskets 730 through conductive contact pieces 740.

Furthermore, in this embodiment, the front casing 500 is further provided with insulated buttons 520 on the side away from the rear casing 600. With the insulated buttons 520, the staff can be authenticated through password recognition. Moreover, the insulated buttons 520 made of an insulating material can effectively avoid damage to the device and human bodies caused by accumulation of a large amount of static electricity generated by frictions in frequent use of the buttons and avoid the damage to the device caused by the accumulation of a large amount of dust due to the accumulated static electricity within the interior of the device.

Furthermore, in this embodiment, the number of the fastener connection structure 100 is more than one, and the more than one fastener connection structures 100 are evenly distributed on the sealing element 400. The connection between the front casing 500 and the rear casing 600 can be effectively strengthened through the more than one evenly distributed fastener connection structures 100. The sealing between the front casing 500 and the rear casing 600 can be further ensured by the sealing element 400, which improves waterproof performance.

This embodiment has the following beneficial effects.

(1) In use, the first connector 110 is fit in and fastened to the first fastener 210 on the front casing 500, the second connector 120 is fit in and fastened to the second fastener 220 on the rear casing 600, and the sealing element 400 is arranged at the connection between the front casing 500 and the rear casing 600, which ensures the sealing of the connection between the front casing 500 and the rear casing 600. Each of the first fastener 210 and the second fastener 220 is composed of the first clamp 231 and the second clamp 232 with an adjustable clamping distance between the first clamp 231 and the second clamp 232, instead of installation through screws in the conventional technology, so that the installation in the present disclosure is convenient and simple, thereby effectively solving the technical problems of poor sealing and inconvenient installation in the conventional technology.

(2) The front casing 500 and the rear casing 600 are installed in a sealed manner only through clamping. In addition, the sealing element 400 has a sealing effect. The installation through screws in the conventional technology is replaced, so that installation holes are eliminated, which reduces the possibility of entry of water, thereby improving waterproof performance.

(3) By setting the first spring 310, the distance between the first connector 110 and the second connector 120 can be effectively adjusted, so that the connection between the front casing 500 and the rear casing 600 is applicable to distribution boxes with different thicknesses, thereby effectively expanding application scope.

(4) By setting the screen 510 and the insulated buttons 520, authentication can be performed by both facial recognition and composite passwords, thereby ensuring security of the authentication through dual encryption.

(5) By setting the metal gasket 730 connected to the screen 510 and making the metal gasket 730 in contact with the wall after installation, static electricity grounding is achieved through corresponding circuits to successfully transfer static electricity, so as to eliminate the static electricity effect of the device through the circuits, thereby achieving a beneficial anti-static effect.

The above embodiments are described in a progressive manner. Each of the embodiments is mainly focused on describing its differences from other embodiments, and references may be made among these embodiments with respect to the same or similar parts.

With the above description of the disclosed embodiments, those skilled in the art can implement or use the present disclosure. Many modifications to these embodiments are apparent for those skilled in the art. The general principle defined herein may be applied to other embodiments without departing from the spirit or scope of the present disclosure. Therefore, the present disclosure should not be limited to the embodiments described herein but have the widest scope that complies with the principle and novelty disclosed herein.

The invention claimed is:

1. An electric power safety authentication device, comprising a front casing, a rear casing, a sealing element, and a fastener connection structure, wherein
   the sealing element is an inflatable sealing element;
   a sealing groove that matches the sealing element is provided at connection between the front casing and the rear casing;
   the fastener connection structure comprises a first connector, a second connector, a first fastener, a second fastener, a first spring, and second springs;
   the first spring is arranged inside the sealing element;
   the first connector and the second connector are arranged at two ends of the first spring respectively, and both the first connector and the second connector penetrate the sealing element;
   a circular groove is provided on each of the first connector and the second connector;
   the first fastener is arranged on the front casing, and the second fastener is arranged on the rear casing;
   the first fastener and the second fastener each comprise a first clamp and a second clamp;
   the first clamp and the second clamp are each connected to the front casing or the rear casing through the second spring;
   the first clamp and the second clamp collectively define a clamping space that matches the circular groove; and
   the first connector is fit in and fastened to the first fastener, and the second connector is fit in and fastened to the second fastener.

2. The electric power safety authentication device according to claim 1, wherein the first connector and the second connector each comprise a first cylinder and a second cylinder;
   the circular groove is provided on the first cylinder;
   a first end of the second cylinder is detachably connected to the first cylinder, and a second end of the second cylinder is connected to the first spring.

3. The electric power safety authentication device according to claim 2, wherein
   the inflatable sealing element and the second cylinder are connected in a sealed manner.

4. The electric power safety authentication device according to claim 3, wherein the first cylinder and the second cylinder are connected through a first connecting body in threaded connection.

5. The electric power safety authentication device according to claim 4, wherein a threaded groove is provided on the second cylinder; and
   the first connecting body is provided with a threaded cylinder that matches the threaded groove.

6. The electric power safety authentication device according to claim 1, wherein an extension-retraction groove is provided on each of a side of the first clamp and a side of the second clamp, wherein the two sides face away from each other; and
   a first end of the second spring is installed in the extension-retraction groove, and a second end of the second spring is connected to the front casing or the rear casing through a connecting block.

7. The electric power safety authentication device according to claim 1, wherein the front casing is provided with a screen on a side away from the rear casing.

8. The electric power safety authentication device according to claim 7, wherein the rear casing is provided with a metal gasket on a side away from the front casing; and
   the screen is connected to the metal gasket through a wire.

9. The electric power safety authentication device according to claim 1, wherein the front casing is further provided with insulated buttons on a side away from the rear casing.

10. The electric power safety authentication device according to claim 1, wherein the number of the fastener connection structure is more than one, and the more than one fastener connection structures are evenly distributed on the sealing element.

* * * * *